United States Patent [19]

Yamada

[11] Patent Number: 5,496,742
[45] Date of Patent: Mar. 5, 1996

[54] METHOD FOR MANUFACTURING SEMICONDUCTOR DEVICE ENABLING GETTERING EFFECT

[75] Inventor: Manabu Yamada, Tokyo, Japan

[73] Assignee: NEC Corporation, Tokyo, Japan

[21] Appl. No.: 199,699

[22] Filed: Feb. 22, 1994

[30] Foreign Application Priority Data

Feb. 22, 1993 [JP] Japan .................................. 5-054681

[51] Int. Cl.⁶ .................................................. H01L 21/322
[52] U.S. Cl. .................................... 437/10; 437/11
[58] Field of Search .................................. 437/10, 12, 41, 437/13, 11; 148/DIG. 60, DIG. 126; 257/913, 328

[56] References Cited

U.S. PATENT DOCUMENTS

| | | | |
|---|---|---|---|
| 4,791,074 | 12/1988 | Tsunashima et al. | 437/13 |
| 4,828,629 | 5/1989 | Ikeda et al. | 437/12 |
| 4,898,835 | 2/1990 | Cawlfield | 437/41 DM |
| 4,928,163 | 5/1990 | Yoshida et al. | 357/23.3 |
| 4,994,404 | 2/1991 | Sheng et al. | 437/44 |
| 5,171,705 | 12/1992 | Choy | 437/41 DM |
| 5,360,748 | 11/1994 | Nadahara et al. | 437/10 |
| 5,444,002 | 8/1995 | Yang | 437/41 DM |

FOREIGN PATENT DOCUMENTS

| | | | |
|---|---|---|---|
| 0492991A2 | 1/1992 | European Pat. Off. | 437/10 |
| 0587335A2 | 3/1994 | European Pat. Off. | 437/12 |
| 555232A | 3/1993 | Japan | 437/12 |

*Primary Examiner*—George Fourson
*Assistant Examiner*—S. Mulpuri
*Attorney, Agent, or Firm*—Burns, Doane, Swecker & Mathis

[57] ABSTRACT

A gate insulating layer and a gate electrode are formed on a semiconductor substrate. An oxidation stopper made of silicon nitride is formed on a sidewall of the gate electrode and a sidewall of the gate insulating layer. Then, a diffusion and oxidation process is carried out for gettering impurities from the semiconductor substrate.

5 Claims, 7 Drawing Sheets

METHOD FOR MANUFACTURING SEMICONDUCTOR DEVICE ENABLING GETTERING EFFECT

BACKGROUND OF THE INVENTION

1. Field of the Invention

The present invention relates to a method for manufacturing a semiconductor device such as a metal oxide semiconductor (MOS) device enabling the effect for gettering of impurities from a semiconductor substrate.

2. Description of the Related Art

In general, a MOS structure is obtained by forming a gate insulating layer and a gate electrode on a semiconductor substrate. In order to reduce a fluctuation in threshold voltage of the MOS structure, a diffusion and oxidation process is carried out for gettering impurities from the semiconductor substrate. In this diffusion and oxidation process, an oxidation layer made of silicon dioxide is formed on the semiconductor substrate and the gate electrode.

In the above-mentioned diffusion and oxidation process, however, the oxidation layer is also grown between the semiconductor substrate and the gate electrode, and as a result, the edge of the gate electrode is deformed, i.e., warped, which will be explained later in detail. This warped edge of the gate electrode fluctuates the threshold voltage of the MOS structure i.e., deteriorates the characteristic of threshold voltage of the MOS structure.

SUMMARY OF THE INVENTION

It is an object of the present invention to suppress the fluctuation of threshold voltage of a MOS structure even after a diffusion and oxidation process for gettering impurities from a semiconductor substrate is carried out.

According to the present invention, a gate insulating layer and a gate electrode are formed on a semiconductor substrate. An oxidation stopper made of silicon nitride is formed on a sidewall of the gate electrode and a sidewall of the gate insulating layer. Then, a diffusion and oxidation process is carried out for gettering impurities from the semiconductor substrate. Thus, since an oxidation layer resulting from the diffusion and oxidation process is hardly grown between the semiconductor substrate and the gate electrode, the edge of the gate electrode is not warped.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art semiconductor device will be explained with reference to FIGS. 1, 2A through 2D, and 3.

Figure 1:
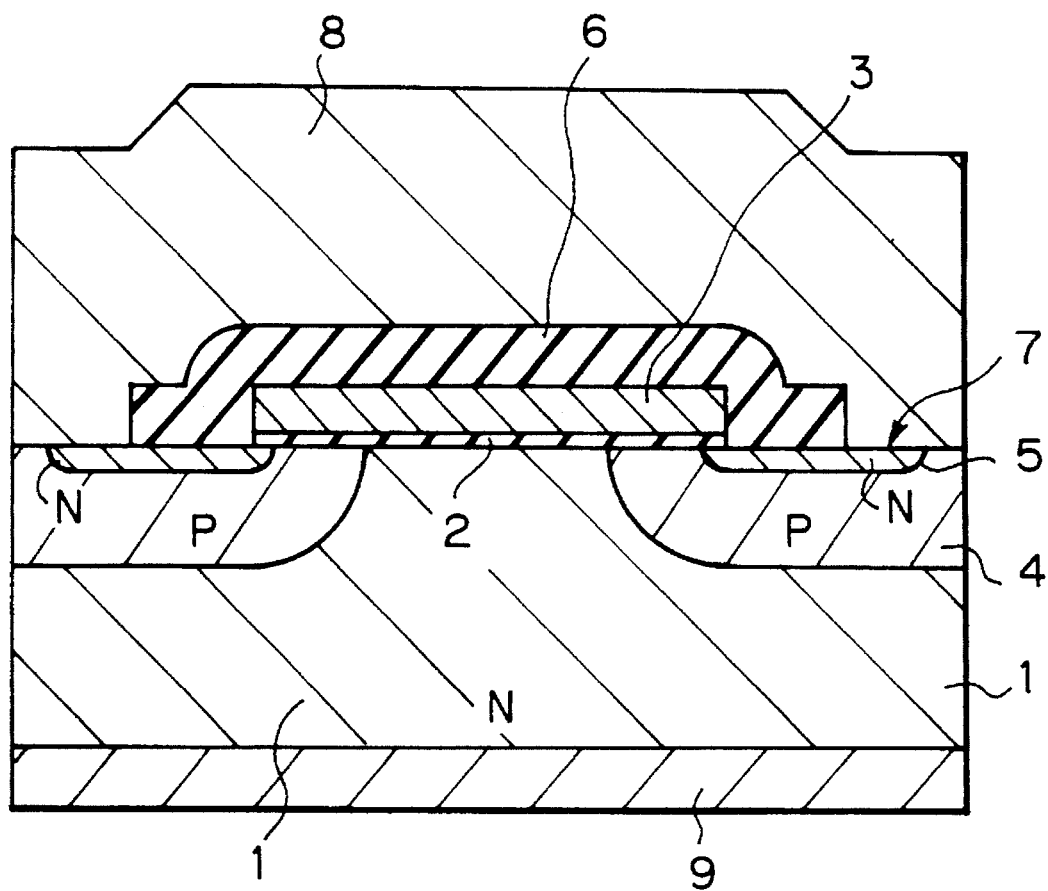
FIG. 1 is a cross-sectional view illustrating a prior art semiconductor device.

In FIG. 1, which illustrates a prior art MOS structure of a vertical type, reference numeral 1 designates an N-type monocrystal silicon substrate (drain region) having about $10^{30}$ atm/cm$^3$ on which a gate insulating layer 2 and a gate electrode 3 are formed. Also, formed within the substrate 1 beneath and outside of the gate electrode 3 is a P-type base region 4. Further, formed within the base region 4 is a shallow N-type source region 5. An insulating layer 6 is formed and an opening 7 is formed in the insulating layer 6. A source electrode 8 is connected via the opening 7 to the source region 5, and a drain electrode 9 is connected to a rear face of the substrate 1.

The manufacture of the device of FIG. 1 is explained next with reference to FIGS. 2A through 2D.

Figure 2A:
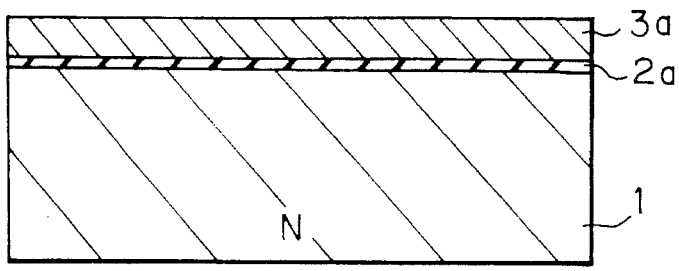
FIGS. 2A through 2D are cross-sectional views explaining the manufacturing steps of the device of FIG. 1.

Referring to FIG. 2A, a 100 to 1000 Å thick silicon dioxide layer 2a is formed by thermally growing the substrate 1, and a 5000 Å thick polycrystalline silicon layer 3a is formed thereon by a chemical vapor deposition (CVD) process.

Figure 2B:
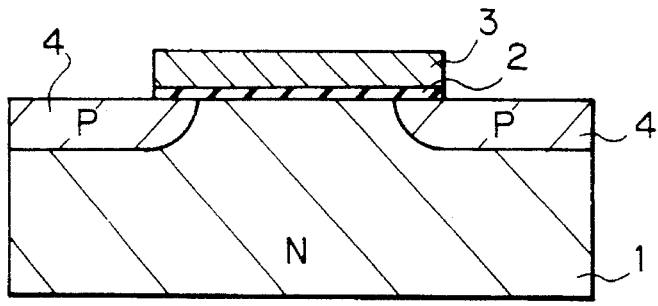

Next, referring to FIG. 2B, the silicon dioxide layer 2a and the polycrystalline silicon layer 3a are patterned by a photolithography process to obtain the gate insulating layer 2 and the gate electrode 3. Then, $10^{13}$ boron atoms/cm$^2$ are implanted into the substrate 4 with a mask of the gate electrode 3, to form the base region 4.

Figure 2C:
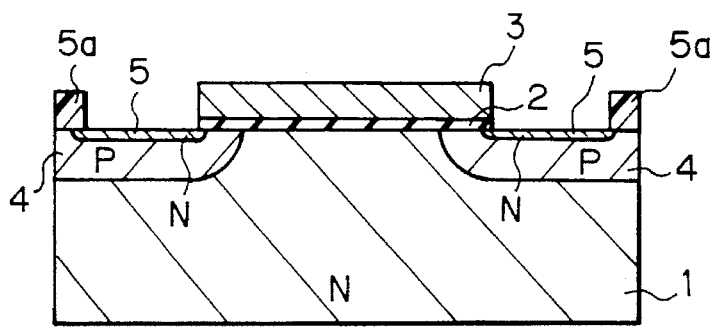

Next, referring to FIG. 2C, a photoresist pattern 5a is formed by a photolithography process. Then, $10^{16}$ phosphorus atoms/cm$^2$ are implanted into the substrate 1 with a mask of the photoresist pattern 5a and the gate electrode 3, to form the source region 5.

Figure 2D:
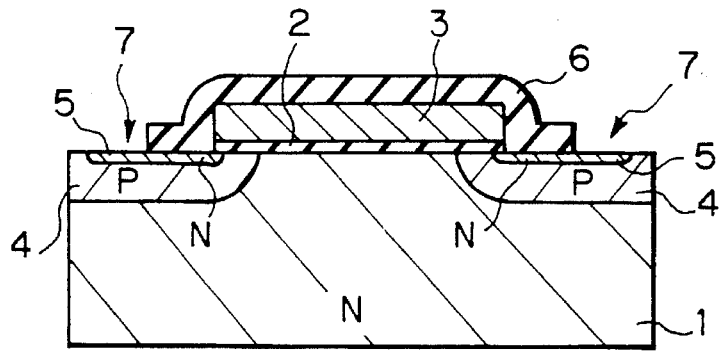

Next, referring to FIG. 2D, the photoresist pattern 5a is removed. Then, a diffusion and oxidation process is carried out for gettering impurities from the semiconductor substrate 1. For example, this diffusion and oxidation process is carried out by using a gas mixture of $O_2$ and $PH_3$ at a temperature of 900° to 950° C. for one hour. Then, a 5000 to 1000 Å thick phosphorus silicated glass (PSG) layer is deposited by a CVD process on the surface, and the opening 7 is formed at the PSG layer to obtain the insulating layer 6.

Finally, the source electrode 8 and the drain electrode 9 are formed, to thereby complete the device of FIG. 1.

Figure 3:
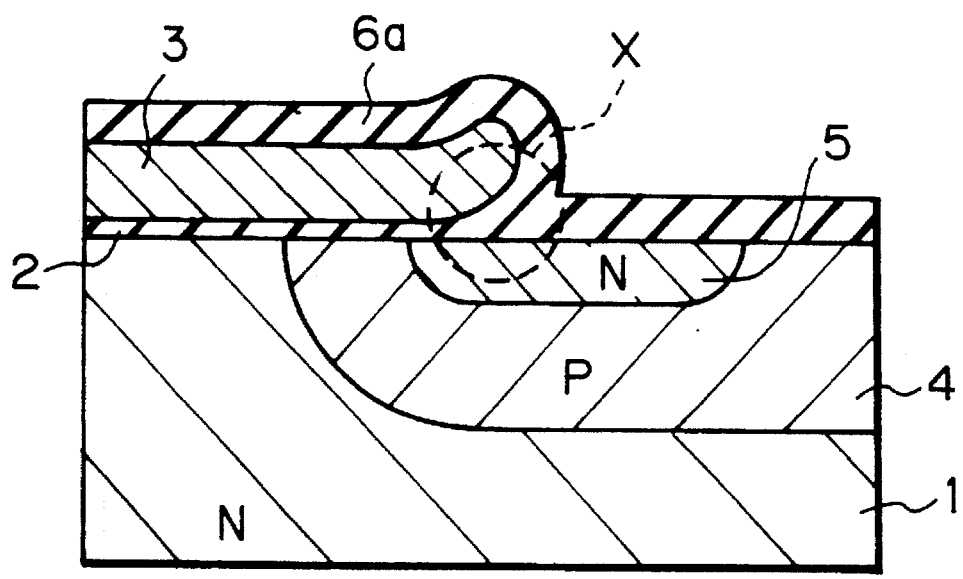
FIG. 3 is a cross-sectional view of an enlargement of the device of FIG. 1 immediately after a diffusion and oxidation process is carried out.

In FIG. 2D, note that the insulating layer 6 includes not only the above-mentioned PSG layer, but also includes a silicon dioxide layer indicated by reference numeral 6a in FIG. 3 which is formed by the diffusion and oxidation process for gettering impurities.

Referring to FIG. 3, which illustrates the device of FIG. 1 immediately after the diffusion and oxidation process is carried out, the silicon dioxide layer 6a is relatively thick on the substrate 1 and the gate electrode 3. Also, the silicon dioxide layer 6a is grown between the gate electrode 3 and the substrate 1, so that the edge of the gate electrode 3 is deformed, i.e., warped as indicated by reference X. If the warped edge of the gate electrode 3 extends over a channel portion of the MOS structure, the threshold voltage is fluctuated, thereby reducing the manufacturing yield.

Figure 4:
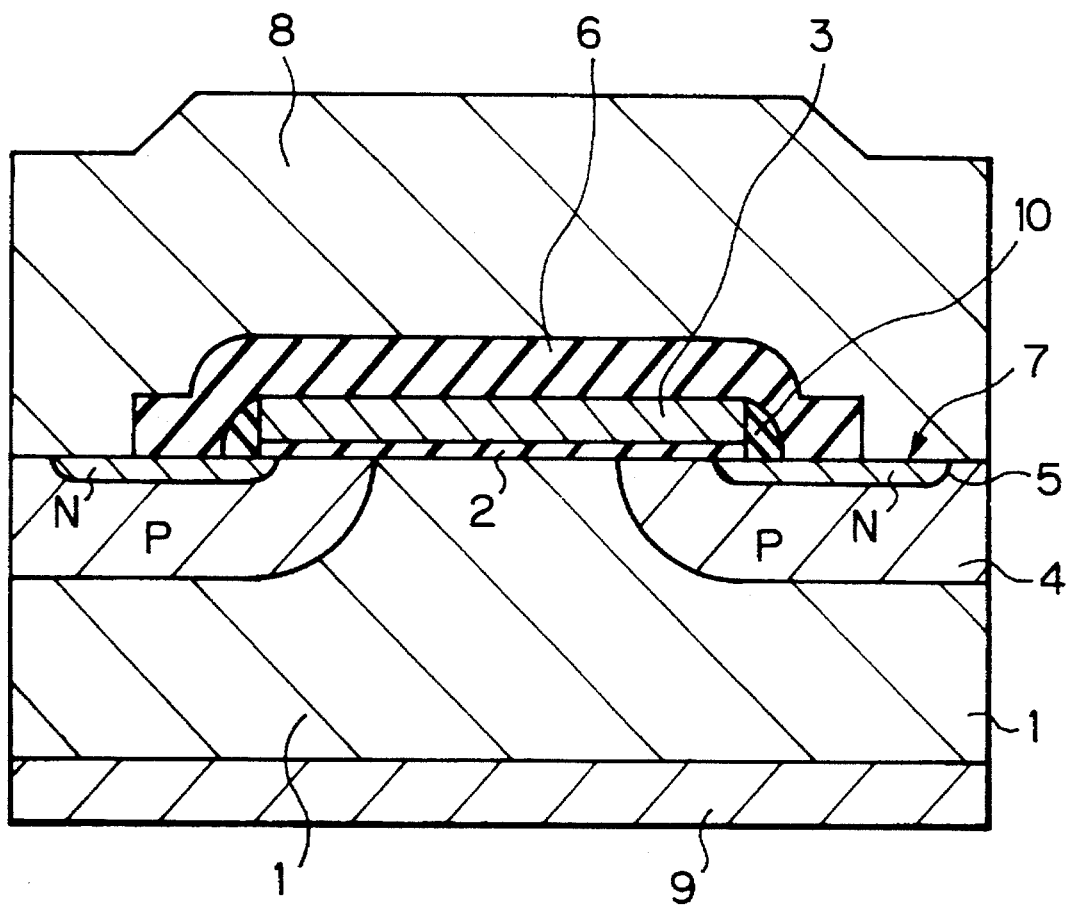
FIG. 4 is a cross-sectional view illustrating an embodiment of the semiconductor device according to the present invention.

In FIG. 4, which illustrates an embodiment of the present invention, an oxidation stopper 10 is added to the elements of FIG. 1, to thereby avoid the growth of silicon dioxide between the gate electrode 3 and the substrate 1 when a diffusion and oxidation process for gettering impurities is carried out.

The manufacture of the device of FIG. 4 is explained with reference to FIGS. 5A through 5F.

Figure 5A:
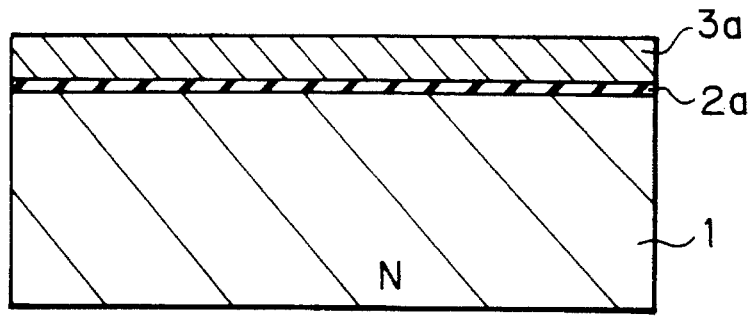
FIGS. 5A through 5F are cross-sectional views explaining the manufacturing steps of the device of FIG. 4.
Figure 5B:
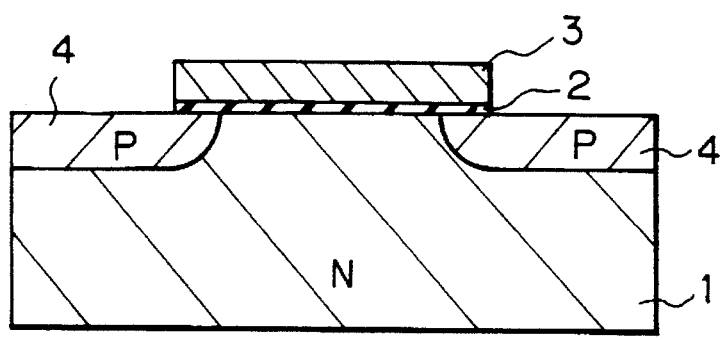
Figure 5C:
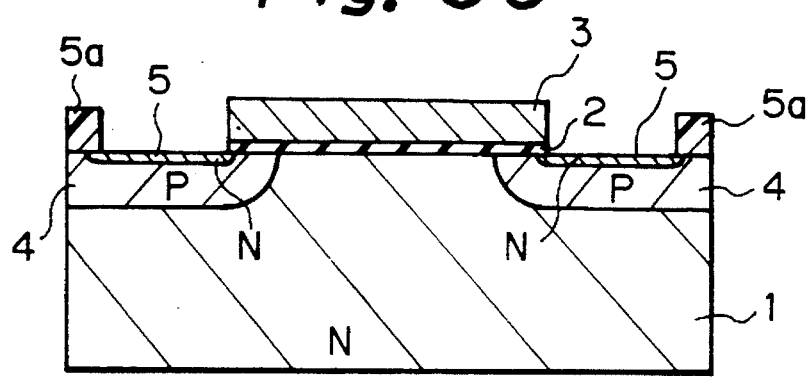

Referring to FIGS. 5A, 5B and 5C which are the same as FIGS. 2A, 2B and 2C, respectively, a 100 to 1000 Å thick silicon dioxide layer 2a is formed, and a 5000 Å thick polycrystalline silicon layer 3a is formed thereon by CVD process. Then, the silicon dioxide layer 2a and the polycrystalline silicon layer 3a are patterned by a photolithography process to obtain the gate insulating layer 2 and the gate electrode 3. Then, $10^{13}$ boron atoms/cm² are implanted into the substrate 4 with a mask of the gate electrode 3, to form the base region 4. Then, a photoresist pattern 5a is formed by a photolithography process. Then, $10^{16}$ phosphorus atoms/cm² are implanted into the substrate 1 with a mask of the photoresist pattern 5a and the gate electrode 3, to form the source region 5.

Figure 5D:
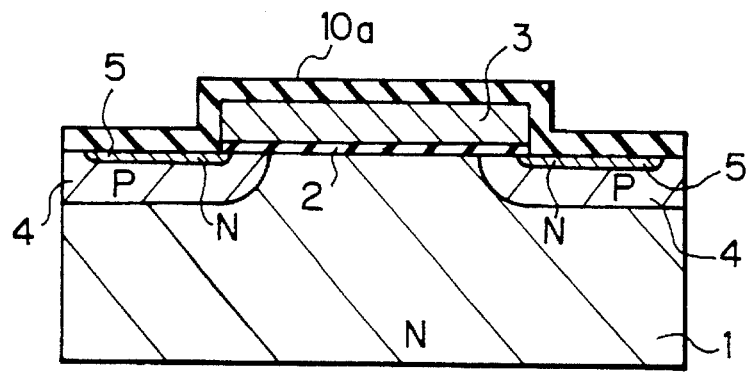

Next, referring to FIG. 5D, the photoresist pattern 5a is removed. Then, an about 500 Å thick silicon nitride layer 10a is deposited by a CVD process.

Figure 5E:
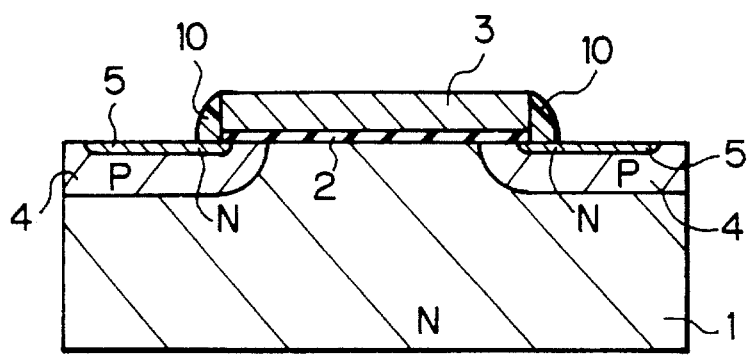

Next, referring to FIG. 5E, the silicon nitride layer 10a is etched back by an anistropic etching process, so that the oxidation stopper 10 remains only on a sidewall of the gate electrode 3 and a sidewall of the gate insulating layer 2.

Figure 5F:
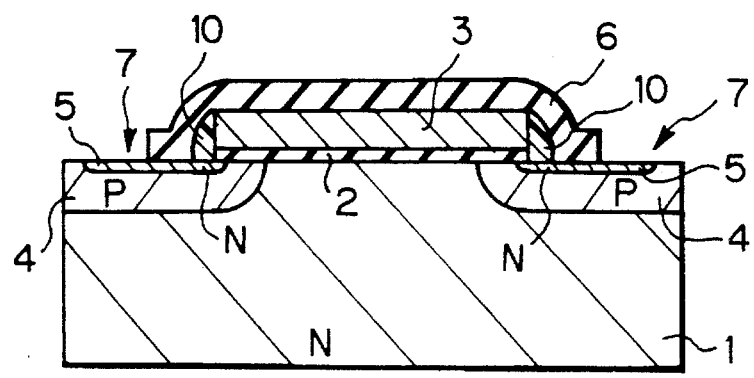

Next, referring to FIG. 5F, a diffusion and oxidation process is carried out for gettering impurities from the semiconductor substrate 1. For example, this diffusion and oxidation process is carried out by using a mixture gas of $O_2$ and $PH_3$ at a temperature of 900° to 950° C. for one hour. Then, a 5000 to 10000 Å thick PSG layer is deposited by a CVD process on the surface, and the opening 7 is formed at the PSG layer, to obtain the layer insulating layer 6.

Finally, the source electrode 8 and the drain electrode 9 are formed, to thereby complete the device of FIG. 4.

Figure 6:
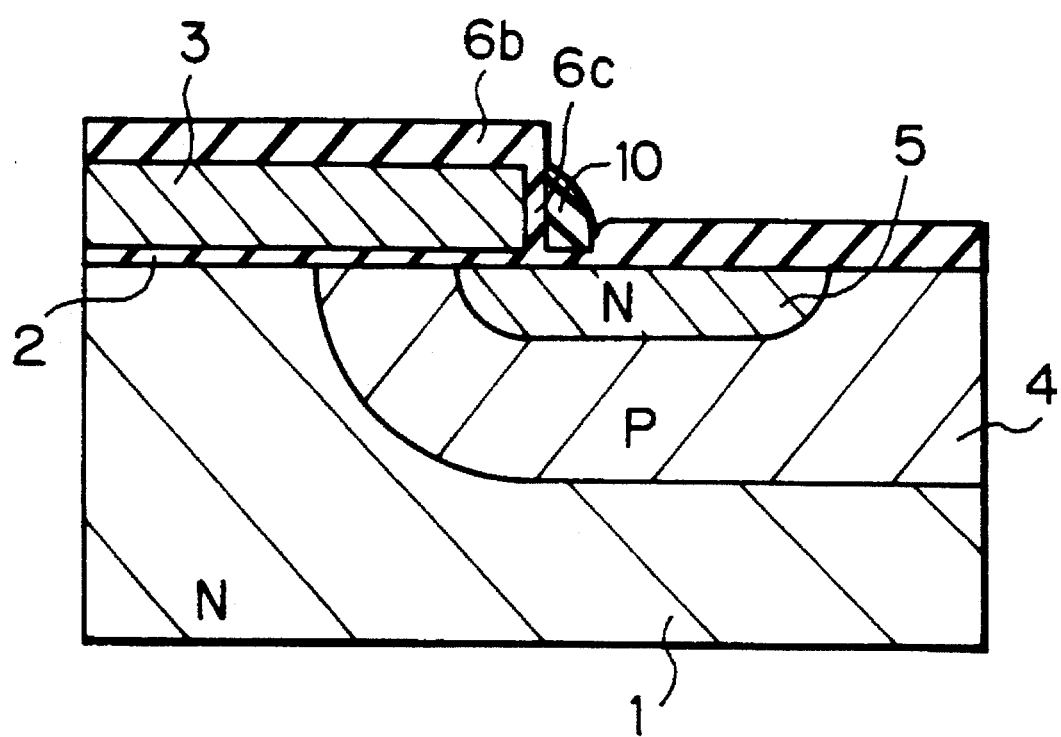
FIG. 6 is a cross-sectional view of an enlargement of the device of FIG. 4 immediately after a diffusion and oxidation process is carried out.

Also, in FIG. 5F, note that the insulating layer 6 includes not only the above-mentioned PSG layer, but also includes a silicon dioxide layer indicated by reference numeral 6b in FIG. 6 which is formed by the diffusion and oxidation process for gettering impurities.

Referring to FIG. 6, which illustrates the device of FIG. 4 immediately after the diffusion and oxidation process is carried out, the silicon dioxide layer 6b is relatively thick on the substrate 1 and the gate electrode 3. However, due to the presence of the oxidation stopper 10, oxygen is hardly supplied to the gate insulating layer 2 between the gate electrode 3 and the substrate 1, so that no further growth by oxidation occurs in the gate insulating layer 2. Therefore, the edge of the gate electrode 3 is not deformed, i.e., not warped, thereby suppressing the fluctuation of threshold voltage, which contributes to the enhancement of the manufacturing yield.

Also, since the oxidation stopper 10 is located only on the sidewall of the gate electrode 3 and the sidewall of the gate insulating layer 2, the introduction of gettering impurities into the substrate 1 is not suppressed, thus maintaining a sufficient gettering effect.

In FIG. 6, a silicon dioxide layer 6c, which is present between the gate electrode 3 and the oxidation stopper (silicon nitride) 10, is called a through oxide layer for reducing damage to the substrate 1 by ion implantation.

Since the silicon dioxide layer 6c is very thin and not indispensible to the present invention, this silicon dioxide layer 6c is omitted from FIG. 5F.

According to normal experiments at room temperature carried out by the inventor, the fluctuation of threshold voltage in the present invention is about 0.2 V, while the fluctuation of threshold voltage in the prior art is about 0.6 V. Also, according to aging experiments at a high temperature carried out by the inventor, the fluctuation of threshold voltage in the present invention is about 5%, while the fluctuation of threshold voltage in the prior art is 12 to 17%.

Although the above-described embodiment exemplifies an N-channel vertical type MOS structure, the present invention can be applied to a P-channel vertical type MOS structure. Of course, the present invention can also be applied to a normal MOSk structure, i.e., a lateral type MOS structure.

As explained hereinbefore, according to the present invention, the fluctuation of threshold voltage can be suppressed, to thereby enhance the manufacturing yield of the semiconductor devices.

I claim:

1. A method for manufacturing a semiconductor device, comprising the steps of:

forming an insulating layer on a semiconductor substrate of a first conductivity type, said semiconductor substrate serving as a drain region;

forming a conductive layer on said insulating layer;

patterning said conductive layer and said insulating layer to form a gate electrode and a gate insulating layer;

forming a base region of a second conductivity type opposite to the first conductivity type within said semiconductor substrate with a mask of said gate electrode;

forming a source region of the first conductivity type within said base region;

forming an oxidation stopper on a sidewall of said gate electrode and a sidewall of said gate insulating layer, wherein said oxidation stopper forming step further comprises the steps of:

forming a silicon nitride layer; and etching back said silicon nitride layer using an anisotropic etching process, so that said silicon nitride layer remains only on the sidewall of said gate electrode and the sidewall of said gate insulating layer; and carrying out a diffusion and oxidation process for gettering impurities from said semiconductor substrate.

2. A method as set forth in claim 1, wherein said diffusion and oxidation step comprises a step of doping with a gas mixture of $O_2$ and $PH_3$ at a temperature of about 900° to 950° C.

3. A method as set forth in claim 1, wherein said insulating layer is made of silicon dioxide and said conductive layer is made of polycrystalline silicon.

4. A method as set forth in claim 1, further comprising the steps of:

forming an insulating layer on at least said source region;

patterning said insulating layer to form an opening leading to said source region; and forming a source electrode connected to said source region.

5. A method for manufacturing a semiconductor device, comprising the steps of:

forming an insulating layer on a semiconductor substrate of a first conductivity type, said semiconductor substrate serving as a drain region;

forming a conductive layer on said insulating layer;

patterning said conductive layer and said insulating layer to form a gate electrode and a gate insulating layer;

forming a base region of a second conductivity type opposite to the first conductivity type within said semiconductor substrate with a mask of said gate electrode;

forming a source region of the first conductivity type within said base region;

forming an oxidation stopper of silicon nitride on a sidewall of said gate electrode and a sidewall of said gate insulating layer;

carrying out a diffusion and oxidation process for gettering impurities from said semiconductor substrate; and forming a drain electrode connected to a rear face of said semiconductor substrate.

* * * * *